(12) United States Patent
Sato et al.

(10) Patent No.: US 9,266,215 B2
(45) Date of Patent: Feb. 23, 2016

(54) METHOD OF DOUBLE-SIDE POLISHING WAFER

(71) Applicant: SHIN-ETSU HANDOTAI CO., LTD., Tokyo (JP)

(72) Inventors: Kazuya Sato, Nasushiobara (JP); Yuki Tanaka, Nishigo-mura (JP); Syuichi Kobayashi, Shirakawa (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/370,922

(22) PCT Filed: Jan. 30, 2013

(86) PCT No.: PCT/JP2013/000482
§ 371 (c)(1),
(2) Date: Jul. 7, 2014

(87) PCT Pub. No.: WO2013/121718
PCT Pub. Date: Aug. 22, 2013

(65) Prior Publication Data
US 2015/0147942 A1    May 28, 2015

(30) Foreign Application Priority Data

Feb. 15, 2012 (JP) ................................ 2012-030929
Mar. 15, 2012 (JP) ................................ 2012-059341

(51) Int. Cl.
*B24B 37/08* (2012.01)
*B24B 53/017* (2012.01)
(Continued)

(52) U.S. Cl.
CPC ............... *B24B 37/08* (2013.01); *B24B 53/017* (2013.01); *H01L 21/02024* (2013.01); *H01L 21/304* (2013.01)

(58) Field of Classification Search
CPC ...... B24B 37/08; B24B 53/00; B24B 53/017; B24B 53/12; H01L 21/02024; H01L 21/304
See application file for complete search history.

(56) References Cited

U.S. PATENT DOCUMENTS 6,296,554 B1 * 10/2001 Lai et al. ...................... 451/271
6,398,631 B1 *  6/2002 Anderson et al. ............. 451/339
(Continued)

FOREIGN PATENT DOCUMENTS

CN      101239450 A     8/2008
CN      102124546 A     7/2011
(Continued)

OTHER PUBLICATIONS

Office Action issued in Japanese Application No. 2012-59341 dated Oct. 14, 2014 (with partial translation).
(Continued)

*Primary Examiner* — Dung Van Nguyen
(74) *Attorney, Agent, or Firm* — Oliff PLC

(57) ABSTRACT

The present invention provides method of double-side polishing a wafer, including: simultaneously polishing both surfaces of the wafer by holding the wafer in a holding hole of a carrier, interposing the held wafer between upper and lower turn tables to which polishing pads are attached, rotating the carrier about an axis of the carrier and revolving the carrier; and repeating the polishing in a batch manner, wherein a direction in which the carrier is revolved is reversed every polishing batch while repeating the polishing in a batch manner. The method enables wafers with high flatness to be stably obtained while inhibiting reduction in productivity due to dressing.

4 Claims, 4 Drawing Sheets

(51) Int. Cl.
*H01L 21/02* (2006.01)
*H01L 21/304* (2006.01)

(56) References Cited

U.S. PATENT DOCUMENTS

| | | | |
|---|---|---|---|
| 6,793,837 B2 * | 9/2004 | Wenski et al. | 216/88 |
| 7,008,310 B2 * | 3/2006 | Andres | 451/398 |
| 8,414,360 B2 * | 4/2013 | Lee et al. | 451/262 |
| 2002/0115387 A1 * | 8/2002 | Wenski et al. | 451/41 |
| 2008/0194182 A1 | 8/2008 | Nakayama et al. | |
| 2011/0124271 A1 | 5/2011 | Sato et al. | |
| 2012/0100788 A1 | 4/2012 | Yasuda et al. | |

FOREIGN PATENT DOCUMENTS

| | | |
|---|---|---|
| JP | A-7-201789 | 8/1995 |
| JP | A-2001-30164 | 2/2001 |
| JP | A-2002-333528 | 11/2002 |
| JP | A-2003-300153 | 10/2003 |
| JP | A-2004-98264 | 4/2004 |
| JP | 2004141984 A | 5/2004 |
| JP | A-2010-152965 | 7/2010 |
| JP | 2011-025322 A | 2/2011 |
| JP | A-2011-67901 | 4/2011 |
| WO | WO 2010/140595 A1 | 12/2010 |

OTHER PUBLICATIONS

Jan. 27, 2015 Office Action issued in Japanese Application No. 2012-059341.

International Search Report issued in International Patent Application No. PCT/JP2013/000482 mailed Mar. 5, 2013.

Nov. 25, 2015 Chinese Office Action issued in Chinese Application No. 201380006959.X.

* cited by examiner

DIAMOND ABRASIVE SIZE

THE NUMBER OF BATCHES

THE NUMBER OF BATCHES

THE NUMBER OF BATCHES

METHOD OF DOUBLE-SIDE POLISHING WAFER

TECHNICAL FIELD

The present invention relates to a double-side polishing method involving interposing a wafer between upper and lower turn tables, to which the respective polishing pads are attached, and simultaneously polishing both surfaces of the wafer.

BACKGROUND ART

In manufacture of wafers, such as silicon wafers, conventionally, an ingot is sliced into wafers, the wafers are subjected to, in sequence, lapping, etching, and other processes, and at least a main surface of the wafers is then mirror-polished. This polishing process employs a single-side polishing apparatus for polishing one surface of wafers and a double-side polishing apparatus for simultaneously polishing both surfaces of wafers.

A double-side polishing apparatus includes an upper turn table and a lower turn table, and polishing pads, which are typically made of a nonwoven fabric, are attached to the respective turn tables. FIG. 5 illustrates a four-ways type of a double-side polishing apparatus that has a planetary gear structure in which a sun gear 107 is disposed at the center and an internal gear 108 is disposed at the outer circumference. With such a double-side polishing apparatus, wafers are inserted into the respective wafer holding holes 103 formed in a carrier 102 and held therein, a polishing agent is supplied to the wafers from above the wafers, front and back surfaces of the wafers are pressed by the respective polishing pads while the upper and lower turn tables are rotated and the carrier 102 is rotated about its axis and revolved between the sun gear 107 and the internal gear 108. The both surfaces of the wafers are thereby simultaneously polished.

There is a problem in that while a polishing batch is repeated with a double-side polishing apparatus without replacing a polishing pad with a new one, variation in wafer shape among polished wafers gradually increases. This problem is attributed mainly to the lifetime of the polishing pad. As duration of use of the polishing pad increases, excessive polishing at the outer circumference of wafers, which is referred to as an outer circumference sag, easily occurs due to influence of compressibility variation of and clogging of the polishing pad. It is accordingly necessary to dress the surface of the polishing pad in order to eliminate this problem.

A polishing pad for use in a double-side polishing apparatus is typically dressed as follows: Dressing plates are inserted into the respective holding holes of a normal carrier used in polishing of wafers or a carrier dedicated to dressing; this carrier is interposed between the upper and lower turn tables; and the apparatus is operated in the same way as normal polishing.

It is important to dress a polishing pad such that the surface of the polishing pad is carded to stabilize and improve polishing capability. A dressing plate having diamond pellets etc., attached to both its surfaces may be used to achieve such dressing.

When double-side polishing of wafers, such as silicon wafers, is repeated in a batch manner, dressing for the carding of a polishing pad is performed to ensure polishing stability at the beginning of use (the starting up) of a new one and at intervals of prescribed batches. As a polishing batch is repeated, a polishing pad surface roughened by such dressing is gradually smoothed and the outer circumference sag of wafers thereby occurs more frequently, so the dressing performed at the intervals is appropriately needed.

The direction (a dressing direction) of a dressing condition of a polishing pad may be represented by a grain direction and a direction opposite the grain direction, and is determined depending on the direction in which a dress plate is revolved during dressing. Patent Document 1 discloses a method of polishing a wafer with a carrier revolved in a direction opposite the direction in which a dress plate is revolved during dressing in order to obtain a highly flat wafer.

CITATION LIST

Patent Literature

Patent Document 1: Japanese Unexamined Patent publication (Kokai) No. 2004-98264

SUMMARY OF INVENTION

Technical Problem

Although the polishing becomes stable for a while after dressing, if the dressing is performed at a longer interval, then the polishing stability will not be maintained after a while, and the wafer flatness is reduced particularly by occurrence of the outer circumference sag. If the dressing is performed at a shorter interval, then the time required for dressing increases, resulting in deteriorating productivity. There is thus a trade-off between the stability and the productivity.

The present invention was accomplished in view of the above-described problems. It is an object of the present invention to provide a method of double-side polishing a wafer stably into a wafer with high flatness while inhibiting reduction in productivity due to dressing.

Solution to Problem

To achieve this object, the present invention provides a method of double-side polishing a wafer, comprising: simultaneously polishing both surfaces of the wafer by holding the wafer in a holding hole of a carrier, interposing the held wafer between upper and lower turn tables to which polishing pads are attached, rotating the carrier about an axis of the carrier and revolving the carrier; and repeating the polishing in a batch manner, wherein a direction in which the carrier is revolved is reversed every polishing batch while repeating the polishing in a batch manner.

Such a double-side polishing method allows the carrier to always revolve in a direction opposite a dressing direction of the polishing pads even when a polishing batch is repeated, maintaining a dressing condition of the polishing pads for a long time. The method can thereby inhibit reduction in flatness to stably obtain a wafer with high flatness. In addition, the method can decrease the frequency of dressing to suppress reduction in productivity due to dressing.

The method preferably includes dressing the polishing pads such that a mean deviation of surface roughness is not less than 4 μm but not more than 5 μm, the mean deviation of surface roughness being represented by a standard deviation of irregularities of a surface of the polishing pads and obtained by scanning with a contact type of roughness meter in a direction opposite a dressing direction of the polishing pads.

Such a method enables a dressing condition of the polishing pads to be stably maintained for a longer time, stably obtaining a wafer with high flatness even when dressing has not been performed for a long time.

The polishing pads may be dressed with a dresser including diamond abrasives having a size of #100 or less, the diamond abrasives being disposed on a dressing surface.

In such a manner, the mean deviation of surface roughness of the polishing pads can reliably be held within the range from 4 μm to 5 μm.

In the method, the direction in which the carrier is revolved in a polishing batch performed right after the dressing is preferably opposite the dressing direction of the polishing pads right after the dressing.

In such a manner, wafers with high flatness can reliably be obtained in polishing batches performed right after dressing.

Advantageous Effects of Invention

In the present invention, since the direction of revolution of a carrier is reversed every polishing batch while repeating double-side polishing in a batch manner, the carrier can always revolve in a direction opposite a dressing direction of polishing pads, and a dressing condition of the polishing pads can thereby be maintained stably for a long time. Deterioration in flatness, such as particularly an outer circumference sag, can consequently be inhibited to stably obtain a wafer with high flatness. In addition, the frequency of dressing can be decreased to suppress reduction in productivity due to dressing.

DESCRIPTION OF EMBODIMENTS

Hereinafter, embodiments of the present invention will be described, but the present invention is not limited to these embodiments.

When double-side polishing of wafers is repeated in a batch manner with a double-side polishing apparatus, dressing for carding of a polishing pad is commonly performed to ensure polishing stability at the starting up of a new one and at intervals of prescribed batches.

It has been known a method of polishing a wafer with a carrier revolved in a direction opposite the direction in which a dress plate is revolved during dressing in order to obtain a wafer with high flatness. Although polishing becomes stable in some polishing batches after dressing, the frequency of dressing (referred to as interval dressing, hereinafter) performed at intervals of prescribed batches cannot be decreased, because the dressing condition of a polishing pad deteriorates during repeated polishing batches.

The present inventors accordingly have diligently studied to decrease the frequency of the interval dressing while the quality of wafers with high flatness is ensured. The inventors have consequently found that while a polishing batch is repeated with a carrier always revolved in an identical direction, just as a conventional method does, the dressing condition of a polishing pad easily deteriorates. The inventors also have found that the dressing direction is reversed, i.e., a grain direction and a direction opposite the grain direction of polishing pads are reversed by polishing a wafer, and when the direction of the revolution of a carrier in a next polishing batch is opposite that in a previous polishing batch, the carrier can always revolve in the direction opposite the dressing direction of the polishing pads, and deterioration of a dressing condition of the polishing pad can thereby be inhibited and a wafer with high flatness can stably be obtained. The inventors thereby have brought the invention to completion.

It is to be noted that the dressing condition of a polishing pad may be represented by roughness measured with a contact type of roughness meter, for example. This roughness, measured with a contact type of roughness meter, exhibits a different value depending on the scanning direction of the measurement. In some embodiments of the invention, a mean deviation of surface roughness, which is represented by a standard deviation of surface irregularities of the polishing pad and obtained by scanning with the contact type of roughness meter in a direction opposite the dressing direction of the polishing pad, is used as an indicator of the dressing condition.

First, a double-side polishing apparatus that can be used in an inventive method of double-side polishing a wafer will be described with reference to FIG. 1 and FIG. 2.

Figure 1:
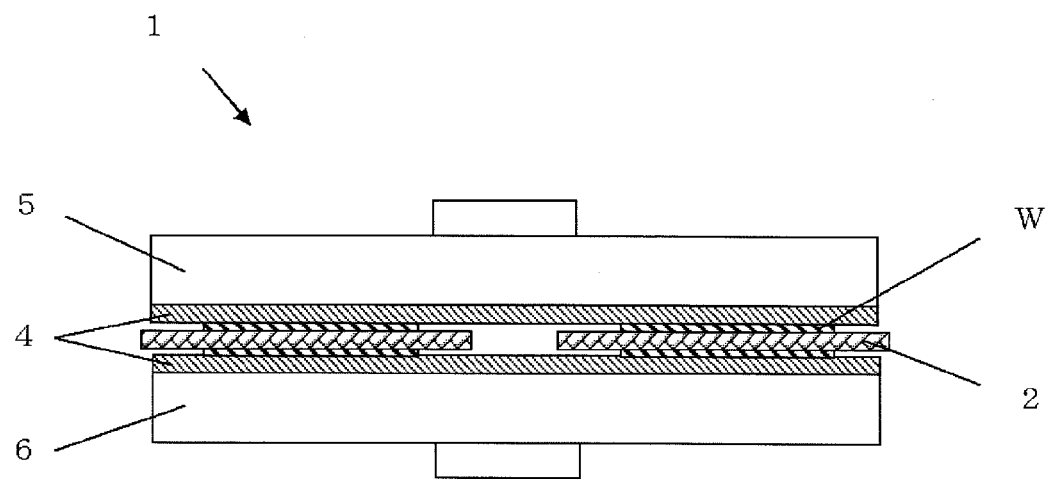
FIG. 1 is a schematic diagram of an example of a double-side polishing apparatus that can be used in an inventive method of double-side polishing a wafer.

As illustrated in FIG. 1, a double-side polishing apparatus 1 includes an upper turn table 5, a lower turn table 6, and a carrier 2 for holding a wafer W. The upper turn table 5 and the lower turn table 6 are disposed so as to vertically face each other. Polishing pads 4 are attached to the respective turn tables 5 and 6. As illustrated in FIG. 2, in the double-side polishing apparatus 1, a sun gear 7 is provided at the center and an internal gear 8 is provided at the outer circumference. The wafer W is held in a holding hole 3 of the carrier 2, and interposed between the upper turn table 5 and the lower turn table 6.

Some teeth of the sun gear 7 and the internal gear 8 engage with corresponding teeth of an outer circumferential gear of the carrier 2. This structure enables the carrier 2 to rotate about its axis and to revolve around the sun gear 7 by rotating the upper turn table 5 and the lower turn table 6 with an actuator, not shown. At this time, both surfaces of the wafer W, being held in the holding hole 3 of the carrier 2, are simultaneously polished by the upper and lower polishing pads 4. During polishing of the wafer W, a polishing agent is supplied through a nozzle, not shown.

Figure 2:
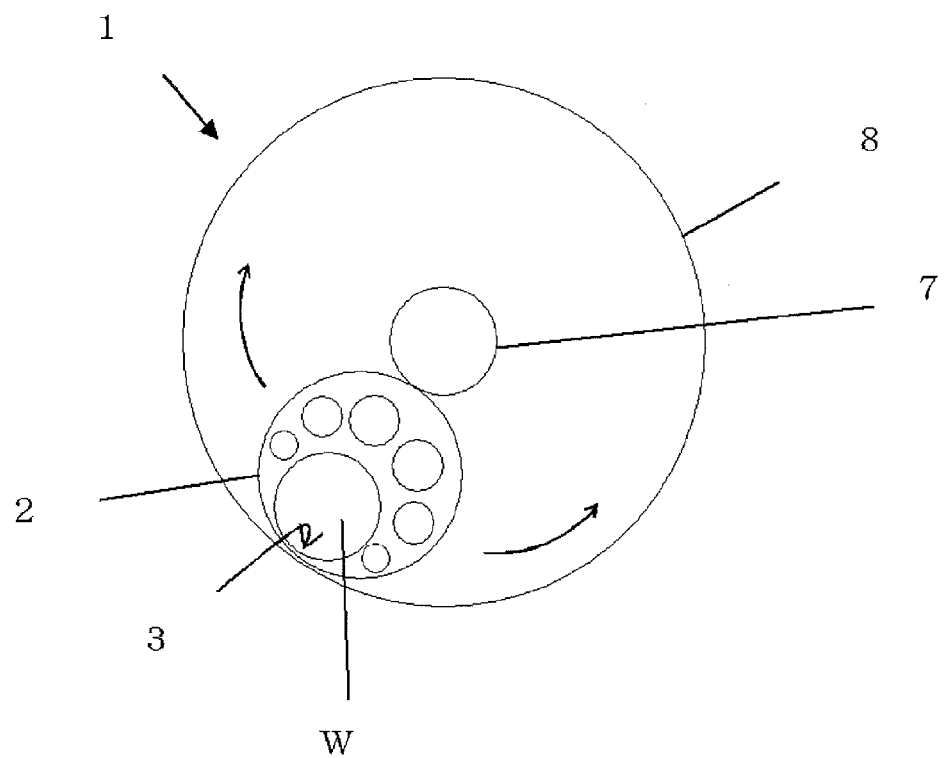
FIG. 2 is a plane view of an internal structure of the double-side polishing apparatus in FIG. 1.
Figure 5:
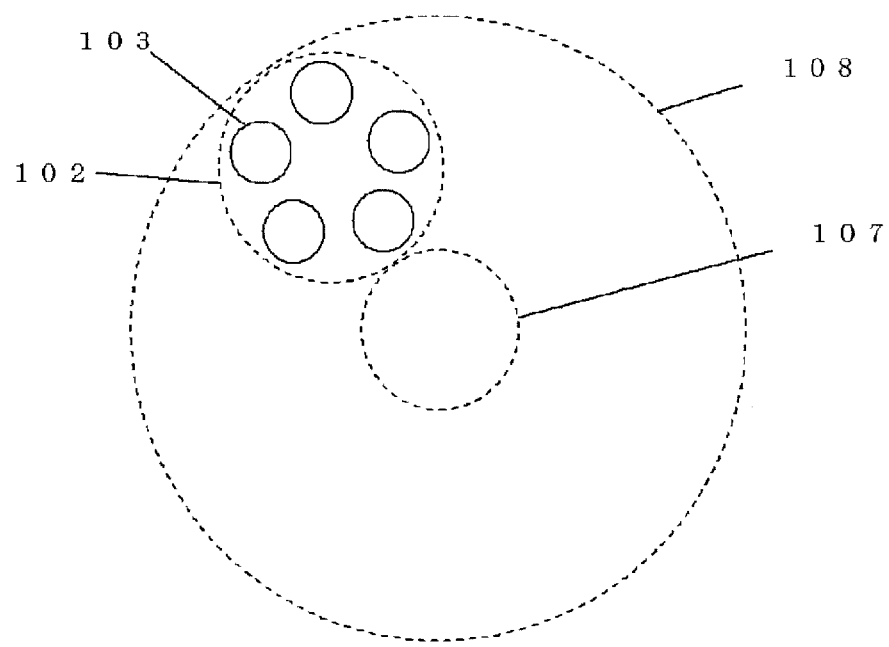
FIG. 5 is an explanatory view of a four-way type of a double-side polishing apparatus.

The carrier 2 holds a single wafer W in FIG. 2, whereas a carrier having a plurality of holding holes may be used to hold a plurality of wafers by the carrier as illustrated in FIG. 5. A double-side polishing apparatus including a plurality of carriers 2 may also be used.

An inventive method of double-side polishing a wafer will be described below with reference to FIGS. 1 to 3.

First, the polishing pads 4 of the double-side polishing apparatus 1 used are dressed (referred to as starting-up dressing, hereinafter) at the starting up (FIG. 3 at (a)). Such dressing is performed just once before use of a new polishing pad 4. This starting-up dressing of the polishing pads 4 may be performed with a dressing plate illustrated in FIG. 4, for example. More specifically, as illustrated in FIG. 4, the dressing plates 10 are set in the respective holding holes of a carrier 9 dedicated to dressing or a carrier identical to one used in polishing of wafers, and interposed between the upper turn table 5 and the lower turn table 6 of the double-side polishing apparatus 1. The double-side polishing apparatus 1 is then operated in a normal polishing manner so that both upper and lower polishing pads 4 are simultaneously dressed.

The dressing plate may be a disk having dressing surfaces on both its front and back faces, and the dressing surfaces can dress the respective upper and lower polishing pads 4 by contact with the pads. The dressing plate may be made of a hard material, such as ceramics, and fine irregularities may be formed on the dressing surfaces. Alternatively, the dressing plate may be of a doughnut shape, in which a hollow is formed at the center, and may be provided with diamond abrasives on the dressing surfaces.

Figure 3:
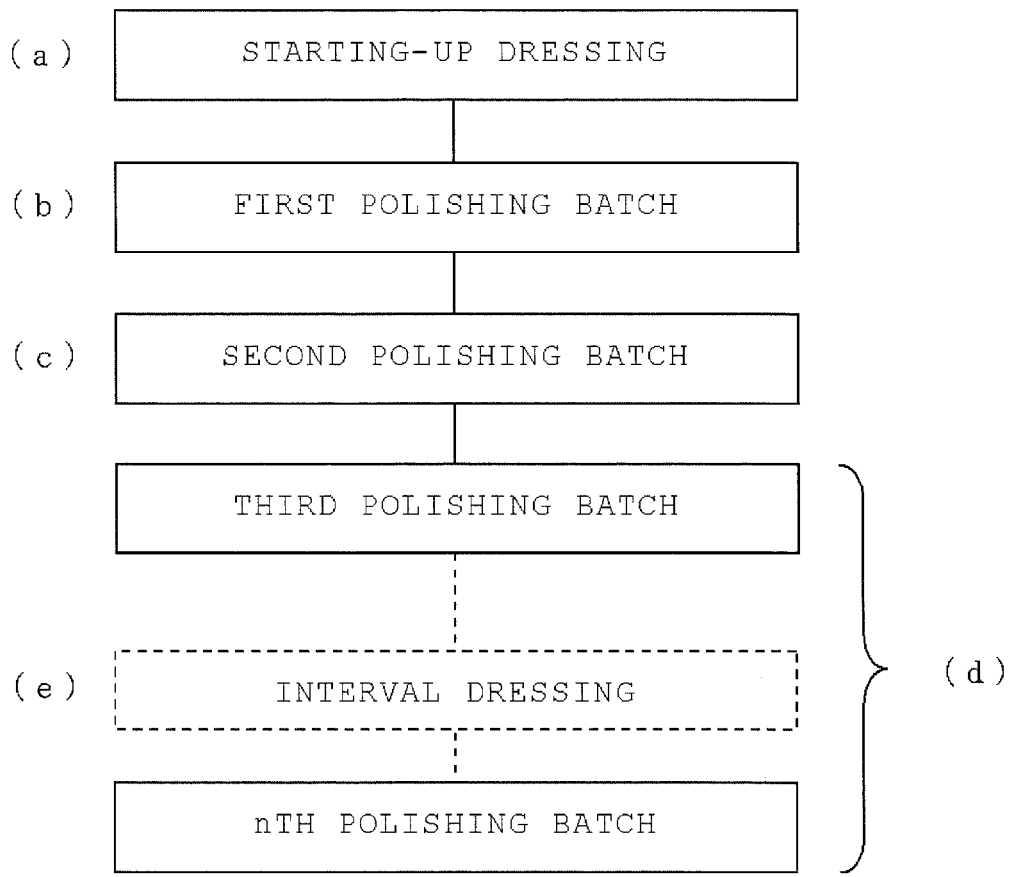
FIG. 3 is a flowchart of an example of an inventive method of double-side polishing a wafer.
Figure 4:
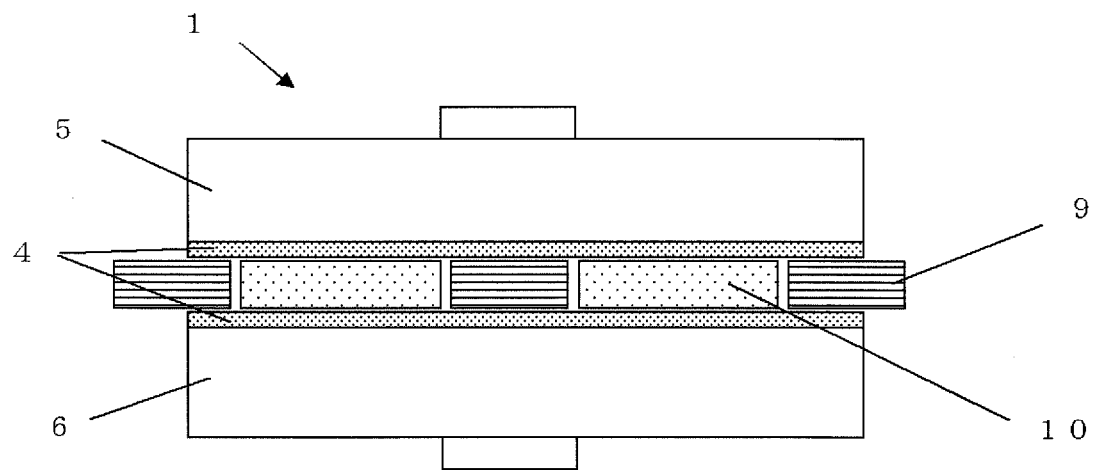
FIG. 4 is an explanatory view of a method of dressing a polishing pad.

After the starting-up dressing, the first polishing batch is processed (FIG. 3 at (b)).

The wafer W is first held in the holding hole 3 of the carrier 2.

The upper and lower surfaces of the held wafer W are then pressed by the respective polishing pads 4 attached to the upper and lower turn tables 5 and 6. The upper and lower turn tables 5 and 6 are rotated, and the carrier 2 is rotated and revolved while a polishing agent is supplied to the polished surfaces, so that both surfaces of the wafer W is polished at the same time.

At this time, the carrier 2 is preferably revolved in a direction opposite the dressing direction of the polishing pads 4, which has been dressed. In this manner, the polishing can stably be performed and a wafer with high flatness can thereby be obtained.

The second polishing batch is processed after the first polishing batch (FIG. 3 (c)).

In the second polishing batch, while the carrier 2 is revolved in a direction opposite the direction of the revolution of the carrier 2 in the first polishing batch, the wafer W is polished under the same conditions, except for the revolution direction of the carrier, as the first polishing batch.

As described above, the dressing direction of the polishing pads 4 is reversed, i.e., the grain direction and the direction opposite the grain direction of the polishing pads 4 are reversed by polishing wafers. More specifically, in second polishing batch, since the direction opposite the dressing direction of the polishing pads 4 is reversed from that in the first polishing batch, if the carrier 2 is revolved in a direction opposite the revolution direction of the carrier 2 in the first polishing batch, then the revolution direction of the carrier 2 is identical to the direction opposite the dressing direction of the polishing pads 4.

After the second polishing batch, the revolution direction of the carrier is also reversed every polishing batch while repeating the polishing in a batch manner (FIG. 3 at (d)).

The inventive double-side polishing method thus allows the carrier to always revolve in a direction opposite the dressing direction of the polishing pads even when a polishing batch is repeated, enabling the flatness, such as typically ESFQR (max), to be stably improved and the wafer to be stably polished with high flatness. In addition, a good dressing condition of the polishing pads can be maintained for a long time, and variation in flatness per batch can be reduced. Although interval dressing may be performed between any batches (FIG. 3 at (e)), the frequency of the interval dressing can be decreased compared with the past, and hence reduction in productivity due to dressing can be suppressed.

In starting-up dressing and interval dressing in the inventive double-side polishing method, the polishing pads 4 are preferably dressed such that the above-described mean deviation of surface roughness is not less than 4 μm but not more than 5 μm. In this manner, the dressing condition of the polishing pads 4 can be stably maintained for a longer time, and a wafer with high flatness can be stably obtained even when dressing has not been performed for a long time.

The interval dressing is preferably performed when the mean deviation of surface roughness falls outside the range from 4 μm to 5 μm. In this manner, the frequency of dressing can significantly be decreased without reducing the flatness.

Figure 6:
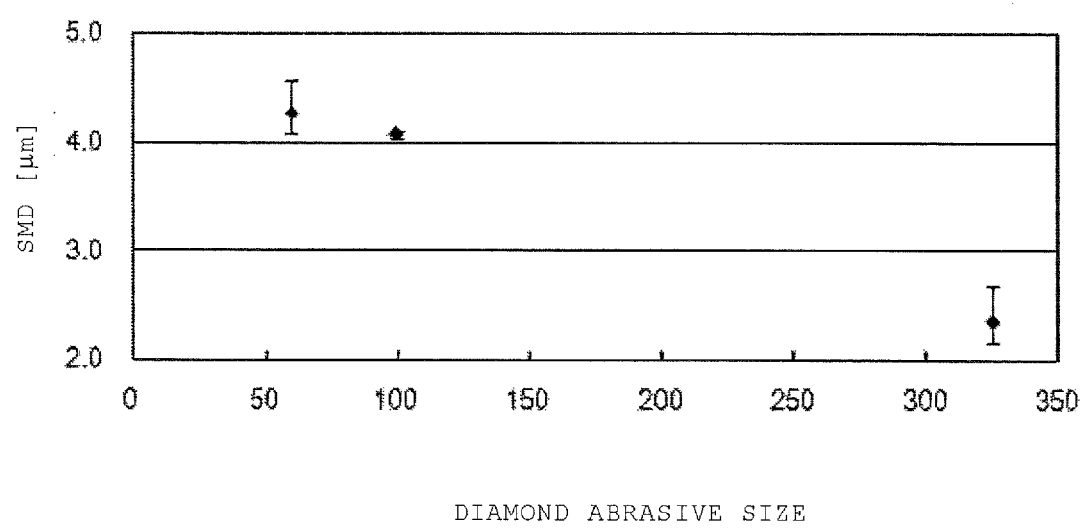
FIG. 6 shows relationship between a mean deviation of surface roughness and a diamond abrasive size when a polishing pad is dressed.

The polishing pads may be polished with a dresser including diamond abrasives that has a size of #100 or less and is disposed on a dressing surface of the dresser. FIG. 6 shows the mean deviation of surface roughness (SMD) of a polishing pad when the polishing pad is dressed with diamond abrasives of different sizes. As shown in FIG. 6, diamond abrasives having a size of #100 or less enable the mean deviation of surface roughness of the polishing pad to reliably fall within the range from 4 μm to 5 μm.

Example

The present invention will be more specifically described with reference to Example and Comparative Example, but the present invention is not limited to these examples.

Example

Five 300-mm-diameter silicon wafers were double-side polished per a single polishing batch with a double-side polishing apparatus (DSP-20B made by Fujikoshi Machinery Corp), as illustrated in FIG. 1, and the polishing batch was repeated until a total of 75 silicon wafers had been double-side polished. The ESFQR (max) of the polished wafers was evaluated with Wafer Sight (made by KLA-Tencor Co., Ltd).

Used were a titanium carrier including a resin ring formed along the inner circumference of a holding hole, polishing pads (MH S-15A made by nitta haas inc.), and a polishing agent obtained by suspending colloidal silica having a diameter of 35 nm into a KOH-based alkali solution.

First, starting-up dressing of the polishing pads was performed with a carrier dedicated to dressing and a dressing plate, as illustrated in FIG. 4. The pressing plate used herein was provided with diamond abrasives having a size of #60 on the dressing surfaces. The load was 100 g/cm$^2$ and the dressing time was 60 minutes.

After the starting-up dressing, wafers were repeatedly polished without any interval dressing between batches. While repeating the polishing, the direction of the revolution of the carrier was reversed every polishing batch. In the first polishing batch, the carrier was revolved in a direction opposite the dressing direction of the polishing pads after the starting-up dressing.

Figure 7A:
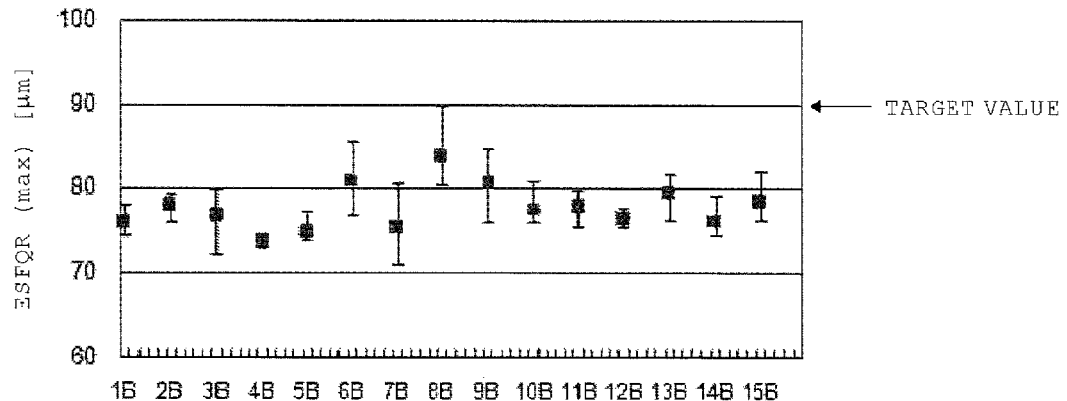
FIG. 7A shows measurement results of the maximum of an edge site front least squares range (ESFQR) in Example.

FIG. 7 shows the result of ESFQR (max) of the polished wafers. As shown in FIG. 7A, the ESFQR (max) was stably suppressed to a lower level, and all of the polishing batches achieved a target value of 90 nm or less. In Example, since no interval dressing was performed, the process time was reduced. In the later-described Comparative Example, in contrast, variation in ESFQR (max) was larger, and ESFQR (max) exceeded a target value of 90 nm in some cases.

Figure 8:
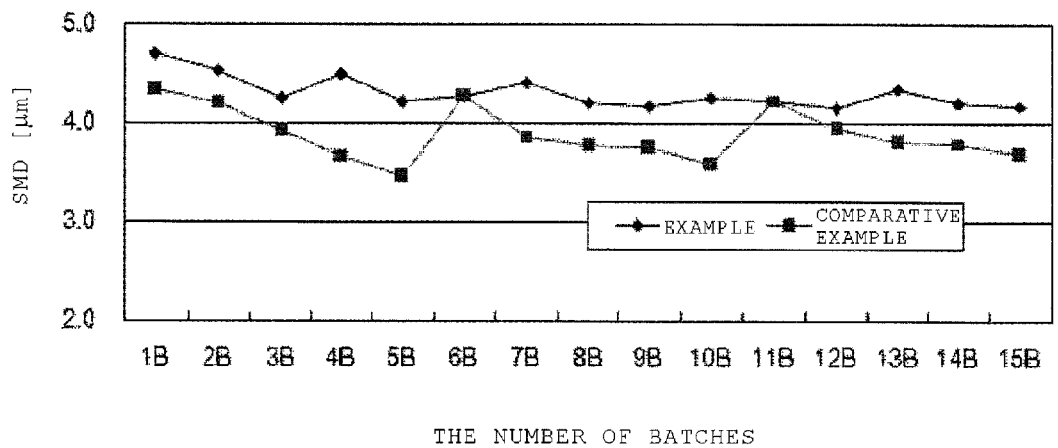
FIG. 8 shows measurement results of the mean deviation of surface roughness in Example and Comparative Example.

FIG. 8 shows the result of the mean deviation of surface roughness of the polishing pads after polishing. As shown in FIG. 8, the mean deviation of surface roughness was held within the range from 4 μm to 5 μm, and did not exhibit its gradual reduction with an increase in the number of polishing batches. The reason is that reversing the revolution direction of the carrier every polishing batch enables deterioration of the dressing condition of the polishing pad to be inhibited.

It was thus confirmed that the inventive double-side polishing method enables a wafer with high flatness to be stably obtained while inhibiting reduction in productivity due to dressing.

Comparative Example

Five 300-mm-diameter silicon wafers were double-side polished per a single polishing batch with the same double-side polishing apparatus as Example, and the polishing batch was repeated until a total of 75 silicon wafers had been double-side polished to make the same evaluation as Example, provided that the polishing batch was repeated without changing the revolution direction of the carrier after starting-up dressing, and interval dressing was performed every five polishing batches. The starting-up and interval dressing was performed in the same way as Example, and the time of the interval dressing was 5 minutes.

Figure 7B:
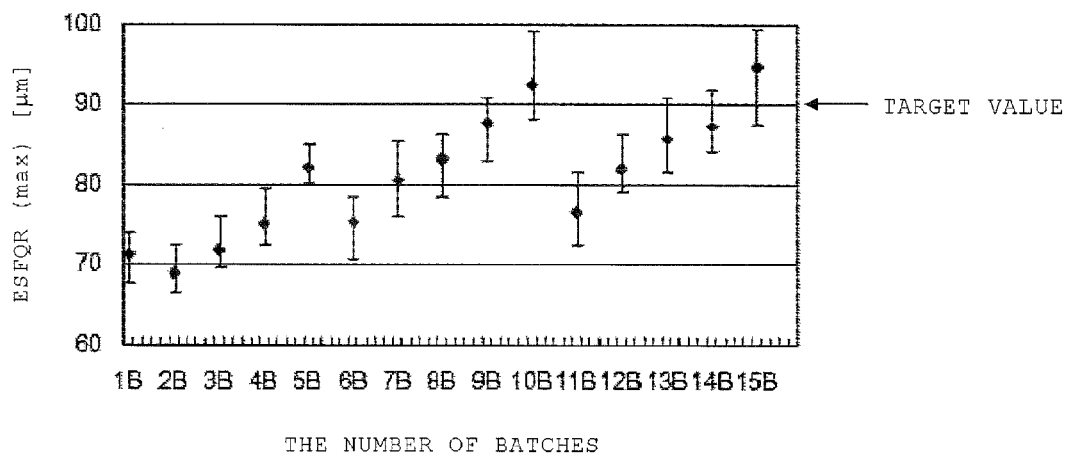
FIG. 7B shows measurement results of the maximum of an edge site front least squares range (ESFQR) in Comparative Example.

FIG. 7 shows the result of ESFQR (max) of the polished wafers. As shown in FIG. 7B, the ESFQR (max) became gradually worse after dressing and largely varied. The ESFQR (max) consequently exceeded a target value of 90 nm in some cases.

FIG. 8 shows the result of the mean deviation of surface roughness of the polishing pads after polishing. As shown in FIG. 8, the mean deviation of surface roughness exhibited its gradual reduction after dressing, which demonstrates deterioration of the dressing condition of the polishing pads.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method of double-side polishing a wafer, comprising:
    simultaneously polishing both surfaces of the wafer by holding the wafer in a holding hole of a carrier, interposing the held wafer between upper and lower turn tables to which polishing pads are attached, rotating the carrier about an axis of the carrier and revolving the carrier;
    repeating the polishing in a batch manner; and
    dressing the polishing pads such that a mean deviation of surface roughness is not less than 4 μm but not more than 5 μm, the mean deviation of surface roughness being represented by a standard deviation of irregularities of a surface of the polishing pads and obtained by scanning with a contact type of roughness meter in a direction opposite a dressing direction of the polishing pads, wherein
    a direction in which the carrier is revolved is reversed every polishing batch while repeating the polishing in a batch manner.

2. The method of double-side polishing a wafer according to claim 1, wherein the polishing pads are dressed with a dresser including diamond abrasives having a size of #100 or less, the diamond abrasives being disposed on a dressing surface.

3. The method of double-side polishing a wafer according to claim 2, wherein the direction in which the carrier is revolved in a polishing batch performed right after the dressing is opposite the dressing direction of the polishing pads right after the dressing.

4. The method of double-side polishing a wafer according to claim 1, wherein the direction in which the carrier is revolved in a polishing batch performed right after the dressing is opposite the dressing direction of the polishing pads right after the dressing.

* * * * *